United States Patent
Noh et al.

(10) Patent No.: US 9,559,649 B2
(45) Date of Patent: Jan. 31, 2017

(54) CONTROL KNOB DEVICE

(71) Applicants: HYUNDAI MOTOR COMPANY, Seoul (KR); PANASONIC CORPORATION, Osaka (JP)

(72) Inventors: Seungryong Noh, Incheon (KR); Seung Hai Hwang, Hwaseong-si (KR); Takahiro Nishimura, Okayama (JP); Tomohiro Meigi, Oyayama (JP); Jun Sato, Oyayama (JP)

(73) Assignees: Hyundai Motor Company, Seoul (KR); Panasonic Corporation, Osaka (JP)

( * ) Notice: Subject to any disclaimer, the term of this patent is extended or adjusted under 35 U.S.C. 154(b) by 71 days.

(21) Appl. No.: 14/562,393

(22) Filed: Dec. 5, 2014

(65) Prior Publication Data
US 2016/0036401 A1 Feb. 4, 2016

(30) Foreign Application Priority Data
Jul. 30, 2014 (KR) .................. 10-2014-0097356

(51) Int. Cl.
*H03G 3/02* (2006.01)
*B60R 21/09* (2006.01)
(Continued)

(52) U.S. Cl.
CPC ................ *H03G 3/02* (2013.01); *B60R 21/09* (2013.01); *G05G 1/02* (2013.01); *G05G 1/12* (2013.01); *H04R 1/00* (2013.01); *B60K 2350/102* (2013.01)

(58) Field of Classification Search
CPC ...... B60K 2350/102; B60R 21/09; H04R 1/00; G05G 1/12; G05G 1/02; H03G 3/02
(Continued)

(56) References Cited

U.S. PATENT DOCUMENTS 5,665,946 A * 9/1997 Nishijima .............. H01H 25/06
200/18
6,377,239 B1 * 4/2002 Isikawa .................. G05G 9/047
200/5 R (Continued)

FOREIGN PATENT DOCUMENTS

JP 2004-349006 A 12/2004
JP 2005-351843 A 12/2005
(Continued)

OTHER PUBLICATIONS

Detailed Grounds for Rejection Korean Patent Application No. 10-2014-0097356 dated Aug. 5, 2015 with full translation.
(Continued)

*Primary Examiner* — Edwin A. Leon
(74) *Attorney, Agent, or Firm* — McDermott Will & Emery LLP

(57) ABSTRACT

A control knob device that may be used in a vehicle to control audio volume or the like includes a shaft connected with a knob cap, an elastic member pressed by the shaft to be elastically deformed, and a switch located adjacent to the elastic member. The switch includes a switch part configured to output a signal upon a deformation of the elastic member. A deformable member deformed by a load greater than that when the elastic member is deformed and the switch outputs the signal, is configured to change a relative position between the knob cap and the shaft.

12 Claims, 12 Drawing Sheets

(51) Int. Cl.
*G05G 1/02* (2006.01)
*G05G 1/12* (2006.01)
*H04R 1/00* (2006.01)

(58) Field of Classification Search
USPC ............ 200/345, 4, 5 A, 5 R, 17 R, 18, 341, 200/520–521
See application file for complete search history.

(56) References Cited

U.S. PATENT DOCUMENTS 6,410,871 B1 * 6/2002 Rarbach ................ G05G 1/087
200/336
2008/0023313 A1 1/2008 Sack et al.

FOREIGN PATENT DOCUMENTS

| | | |
|---|---|---|
| JP | 2011-54466 A | 3/2011 |
| KR | 10-2004-0100437 A | 12/2004 |
| KR | 10-2006-0033618 A | 4/2006 |
| KR | 10-0740772 B1 | 7/2007 |
| KR | 10-0983329 B1 | 9/2010 |

OTHER PUBLICATIONS

Korean Notice of Patent Allowance issued in Application No. 10-2014-0097356 dated May 18, 2016, with partial English translation.

* cited by examiner (a)           (b)

CONTROL KNOB DEVICE

CROSS-REFERENCE TO RELATED APPLICATION

This application claims the benefit of Korean Patent Application No. P2014-97356, filed on Jul. 30, 2014 in the Korean Intellectual Property Office, the disclosure of which is incorporated herein by reference.

BACKGROUND

1. Field

Embodiments of the present invention relate to a control knob device, and more particularly, to a control knob device used in a vehicle or the like to control e.g., audio volume.

2. Description of the Related Art

A knob configured to turn on/off power, control volume, or change frequency is provided at a front panel of an audio-video (AV) system, which is installed in a vehicle, to protrude by a predetermined height.

In general, the height of the knob protruding from the front panel is 11 mm or more, and this is because the knob should protrude by the predetermined height or more so that a user may operate the knob manually. The protruding height of the knob may be 14 to 15 mm to provide a satisfactory feeling when a user operates the AV system.

However, the European automobile safety standard (ECE R-214), which defines vehicle internal components, defines that a component such as a switch and a pushing knob formed of a hard material should be reduced to a length of 9.5 mm or less, or should be chipped off for passengers' safety, when a vertical load having a certain force (37.8 daN) is applied thereto. The Indian automobile safety standard (IS15223:2002-4.1.5) also requires the above conditions. This is to prevent physical damage which may occur when a driver's head collides with the highly protruding knob.

The automobile-related industry has made continued efforts to satisfy the automobile safety standard having the most stringent conditions and also to satisfy the user's operation and esthetic preference. As part of these efforts, a design in which the front panel around the knob was recessed to be inclined was applied to improve feeling when the user grips the knob. However, the design had a problem in that the overall esthetic feeling of a vehicle interior was reduced, and satisfaction was not sufficient with the recessed portion. As another part of the efforts, it was considered to allow the knob break and contract at the time of collision. However, this caused inconvenience and repair cost due to the broken knob.

Korean Paten Publication No. 10-2009-0009466 discloses a shock absorbing structure of a knob for a vehicle audio system, which is capable of absorbing a shock having a certain pressure applied to the knob configured to operate the vehicle audio system and thus minimizing passenger injury due to contact with the passenger.

SUMMARY

Therefore, it is an aspect of the present invention to provide a control knob device which protrudes from a front panel sufficiently to satisfy operation and esthetics, and is inserted at the time of collision with the user to absorb a shock.

Additional aspects of the invention will be set forth in part in the description which follows and, in part, will be obvious from the description, or may be learned by practice of the invention.

In accordance with one aspect of the present invention, a control knob device includes a shaft connected with a knob cap, a switch part including an elastic member pressed and elastically deformed by the shaft, and a switch located adjacent to the elastic member, the switch outputting a signal by a deformation of the elastic member, and a deformable member, deformed by a load which is greater than that at a moment when the elastic member is deformed and the switch outputs the signal and configured to change a relative position between the knob cap and the shaft.

The control knob device may further include a head connected with the knob cap and having a shaft receiving hole configured to receive the shaft, wherein one side of the deformable member is supported by the head, and the other side thereof is supported by the shaft, and the shaft is pressed by a load applied to the head.

The deformable member may be elastically deformed.

The deformable member may press and move the shaft within a range in which the shaft is moved, and when the shaft is supported by the switch part and movement of the shaft is restricted, elastic deformation thereof may be allowed.

One side of the deformable member may be supported by a support step protruding from an inner circumferential surface of the shaft receiving hole, and the other side thereof may be supported by a support step protruding from an outer circumferential surface of the shaft.

The control knob device may further include a boss coupled with the switch part and having a shaft insertion hole in which the shaft is inserted, wherein a height between an end of the boss, in which the shaft insertion hole is formed, and the support step protruding from the outer circumferential surface of the shaft is greater than or the same as that by which the shaft is inserted into the boss by the deformation of the elastic member.

The control knob device may further include a boss coupled with the switch part and having a shaft insertion hole in which the shaft is inserted, wherein the boss insertion hole is formed at the head, and when the deformable member is deformed, the boss is inserted and received into the boss insertion hole.

An insertion degree of the boss inserted into the boss insertion hole may be restricted by a stopping part formed at a connecting portion of the shaft receiving hole and the boss insertion hole.

An inclined portion or a curved portion may be provided at an edge of an end of the boss, in which the shaft insertion hole is formed, to guide the boss to be easily inserted into the boss insertion hole.

The deformable member may be deformed by a load which is greater than a minimum load necessary to deform the elastic member and to adapt the switch to output the signal.

In accordance with another aspect of the present invention, a control knob device in which a user presses a knob cap and operates a switch includes an elastic member elastically deformed within a predetermined range of a first load, a switch configured to output a signal by a deformation of the elastic member, and a deformable member deformed by a second load greater than the first load to allow a movement of the knob cap.

The deformable member may start to be elastically deformed by action of the second load.

The control knob device may further include a head connected with the knob cap, and a shaft one side of which is received in a shaft receiving hole of the head, and the other side of which presses the elastic member, wherein, when the knob cap is pressed within a range of the first load, the shaft is moved together with the head, the elastic member is deformed, and the switch outputs the signal; and when the knob cap is pressed by a load greater than the second load, the deformable member is deformed, and relative movement of the head and the shaft is allowed.

One side of the deformable member may be supported by a support step protruding from an inner circumferential surface of the shaft receiving hole, and the other side thereof may be supported by a support step protruding from an outer circumferential surface of the shaft, and the shaft may be pressed by a load applied to the head.

The control knob device may further include a switch part including the switch, and a boss coupled with the switch part and having a shaft insertion hole in which the shaft is inserted, wherein a height between an end of the boss, in which the shaft insertion hole is formed, and the support step protruding from the outer circumferential surface of the shaft is greater than or the same as that by which the shaft is inserted into the boss by the deformation of the elastic member.

BRIEF DESCRIPTION OF THE DRAWINGS

These and/or other aspects of the invention will become apparent and more readily appreciated from the following description of the embodiments, taken in conjunction with the accompanying drawings of which:

FIG. 3 is a cross-sectional view illustrating a state in which the conventional control knob device is pressed, wherein FIG. 3A illustrates a state before being pressed, and FIG. 3B illustrates a state after being pressed;

FIGS. 6 to 8 are cross-sectional views respectively illustrating the control knob device in accordance with one embodiment of the present invention, wherein FIG. 6 illustrates a state before being pressed, FIG. 7 illustrates a state of being pressed with a force within a range in which a switch is generally operated, and FIG. 8 illustrates a state of being pressed with a degree of force, at which a shock is applied;

DETAILED DESCRIPTION

Figure 1:
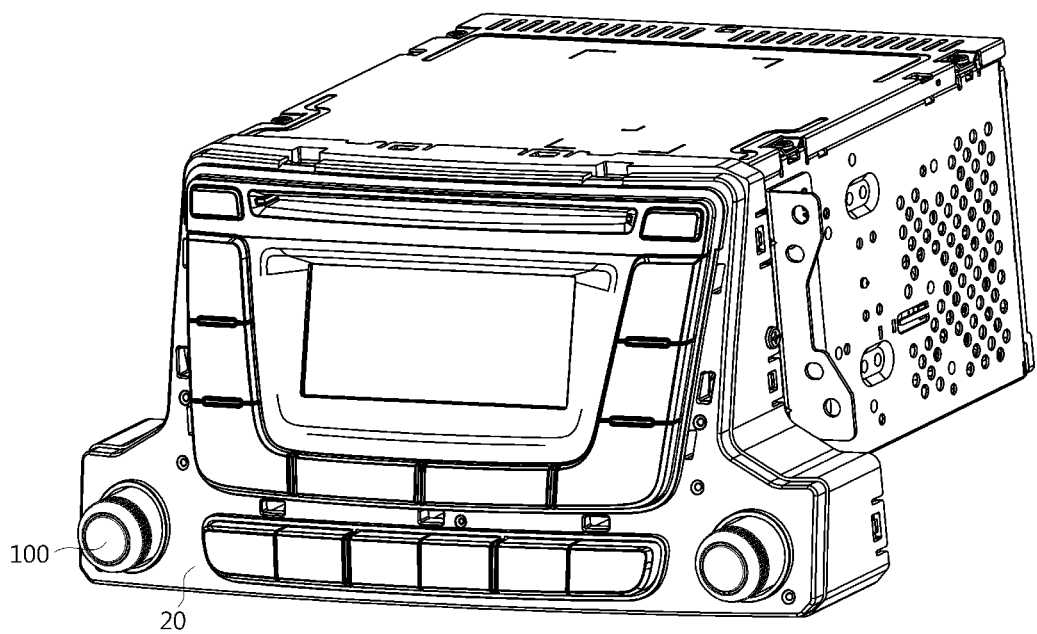
FIG. 1 is a perspective view of a vehicle audio system in which a control knob device in accordance with an embodiment of the present invention is installed.

Hereinafter, exemplary embodiments of the present invention will be described in detail with reference to the accompanying drawings. The embodiments below are provided just to sufficiently convey the spirit of the present invention to those skilled in the art. Thus, the present invention is not limited to the embodiments but may be embodied in another form. In the drawings, to clarify the present invention, elements irrelevant to the description may be omitted, and sizes and shapes of construction elements shown in the drawings may be exaggeratedly illustrated for the sake of convenience and clarity.

FIG. 1 is a perspective view of a vehicle audio system in which a control knob device in accordance with an embodiment of the present invention is installed.

A control knob device 100 which controls an audio function and/or an air-conditioning function is provided at an AV system disposed at a center fascia of a vehicle to protrude outside a front panel 20. As an example, a passenger may rotate the control knob device 100 to control volume, and may press the control knob device 100 to select an on/off state of the audio function.

Figure 2:
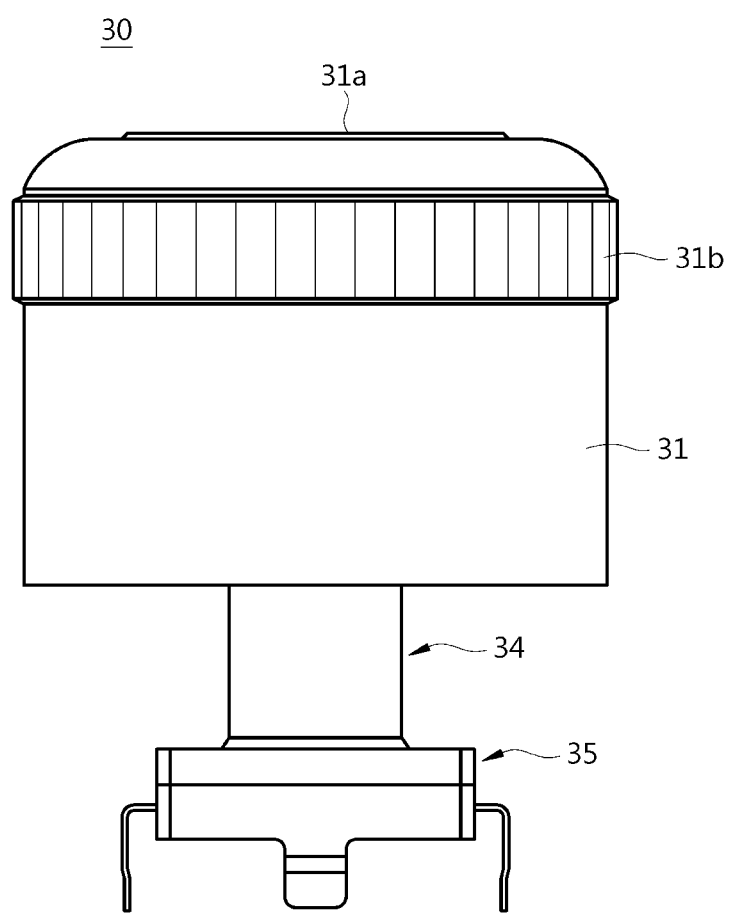
FIG. 2 is a view illustrating a conventional control knob device.
Figure 3:
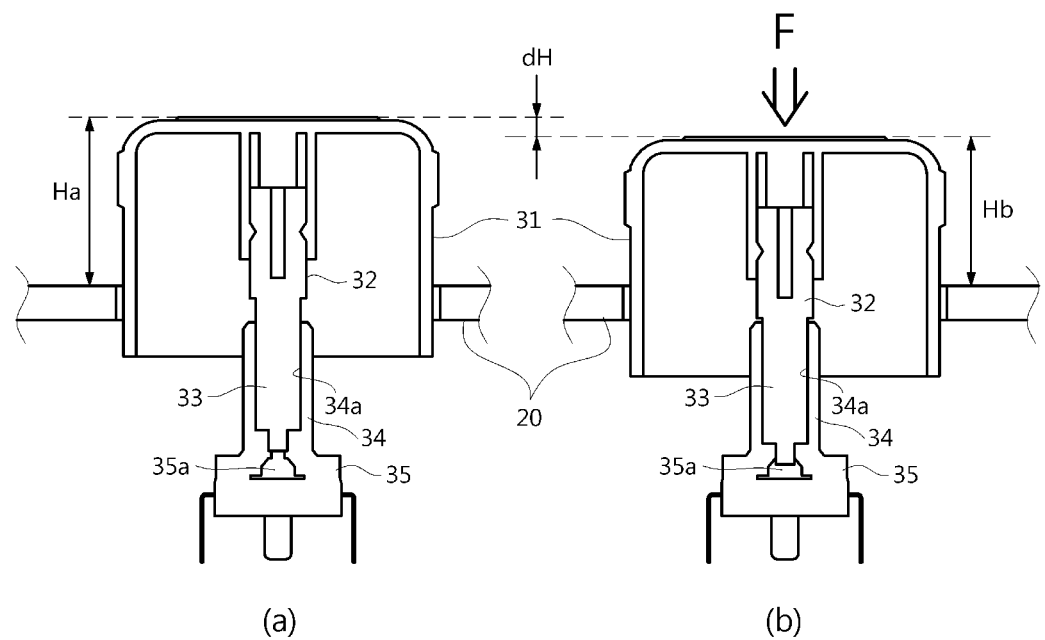

A conventional control knob device 30 will be described with reference to FIGS. 2 and 3. FIG. 2 is a view illustrating the conventional control knob device 30, and FIG. 3 is a cross-sectional view illustrating a state in which the conventional control knob device 30 is pressed.

In general, the control knob device 30 may include a knob cap 31 operated by a user, a head 32 coupled with the knob cap 31, a boss 34 including a shaft 33 connected with the head 32 and an insertion hole 34a in which the shaft 33 is inserted, and a switch part 35 connected with the boss 34.

An operating method of the control knob device 30 will be described with reference to FIG. 3. FIG. 3A illustrates a state of the knob cap 31 before being pressed, and FIG. 3B illustrates a state after being pressed.

In a state before the knob cap 31 is pressed, the control knob device protrudes by a height Ha from the front panel 20. The knob cap 31 may be maintained in a state of protruding from the front panel 20 by an elastic member 35a interposed between a switch and the shaft 33.

When the user presses a push part 31a provided at a distal end of the knob cap 31 and applies a load F, the shaft 33 connected with the knob cap 31 slidably inserts into the insertion hole 34a provided in the boss 34. An end of the shaft 33 applies a force to the elastic member 35a, the elastic member 35a is deformed, and thus a signal is input to the switch. At this time, the protrusion height of the knob cap 31 when the knob cap 31 is inserted into the front panel 20 to input the switch is Hb, and the depth in which the knob cap 31 becomes inserted by the load F is dH corresponding to a difference between the two heights.

Meanwhile, in the control knob device 30, the knob cap 31 may be rotated, and a signal changed according to the degree of rotation of the knob cap 31 may be output. As an example, audio volume level may be controlled by rotation of the knob cap 31. A friction part 31b in which a plurality of protrusions or the like are provided to increase frictional force may be provided on an outer circumferential surface of the knob cap 31, and thus the user may grip the friction part 31b and rotate the knob cap 31.

In the below, descriptions of the control knob device, rotation of the knob cap 31 and related configuration will be omitted. The related technique is conventionally widely used, and thus although description thereof is omitted herein, there is enough description to implement the control knob device in accordance with the described embodiment of the present invention.

Unlike other buttons, the control knob should be rotated as well as pressed by the user, and thus the knob protrudes considerably from the front panel 20. Generally, it is known that when the control knob protrudes a length of about 14 mm or more, an excellent impression of the control knob may be provided while the user rotates the knob to control volume or the like. Therefore, in countries which do not have a separate automobile safety standard, there is no limitation in using a control knob which protrudes by a length of 14 mm or more from the front panel.

However, in some countries such as Europe and India, the length of protrusion of the control knob is limited on the basis of the automobile safety standard for passengers' safety. As an example, the European automobile safety standard (ECE R-214) defines that a component such as a switch and pushing knob formed of a hard material should be contracted to a length of 9.5 mm or less, or should be chipped off, when a vertical load having a certain force (37.8 daN) is applied thereto. This is specified to prevent physical damage which may occur if a passenger were to collide with the highly protruding knob at the time of sudden braking or collision.

However, a push stroke (Hb of FIG. 3) of the control knob, which is contracted when pressing the control knob, is about 1.5 mm. Therefore, if the length of protrusion of the control knob exceeds 11 mm, it is not possible to satisfy the automobile safety standard. Meanwhile, if the push stroke of the control knob, which is contracted when pressing the control knob, is increased to much more than 1.5 mm, the user's impression of operation may be reduced.

Conventionally, to satisfy the European automobile safety standard, methods of fabricating the knob with a rubber material, inserting a member which is broken when a strong impact is applied to the knob, forming a recessed portion at a front panel around the knob to improve the user's operation impression, or the like were used. However, despite such efforts, it is not yet sufficient to provide satisfactory results in enhancing the user's impression, overall esthetics, and unity.

The described embodiments of the present invention provide a control knob device 100 which protrudes from the front panel 20 sufficiently to satisfy the user's impression during operation, and aesthetics, and becomes inserted into the front panel 20 upon collision with the user to absorb the shock, and also to satisfy the European automobile safety standard.

To this point, a control knob device used in a vehicle has been described, but the description herein is only an example. The control knob device 100 in accordance with various embodiments of the present invention may be widely used in products for home use or industrial use as well as a vehicle. Further, the control knob device 100 in accordance with embodiments of the present invention may include a control knob used in places other than the center fascia of a vehicle.

Figure 4:
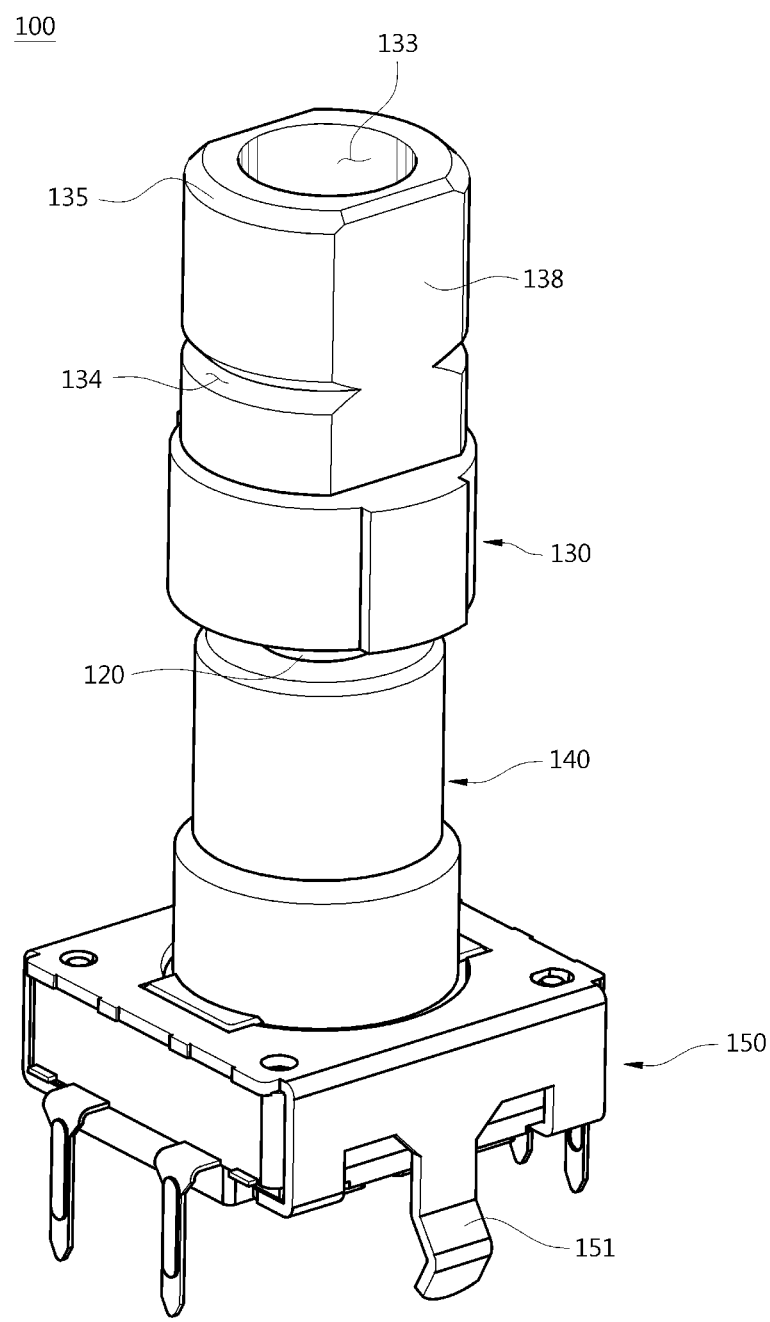
FIG. 4 is a perspective view illustrating the control knob device in accordance with an embodiment of the present invention.
Figure 5:
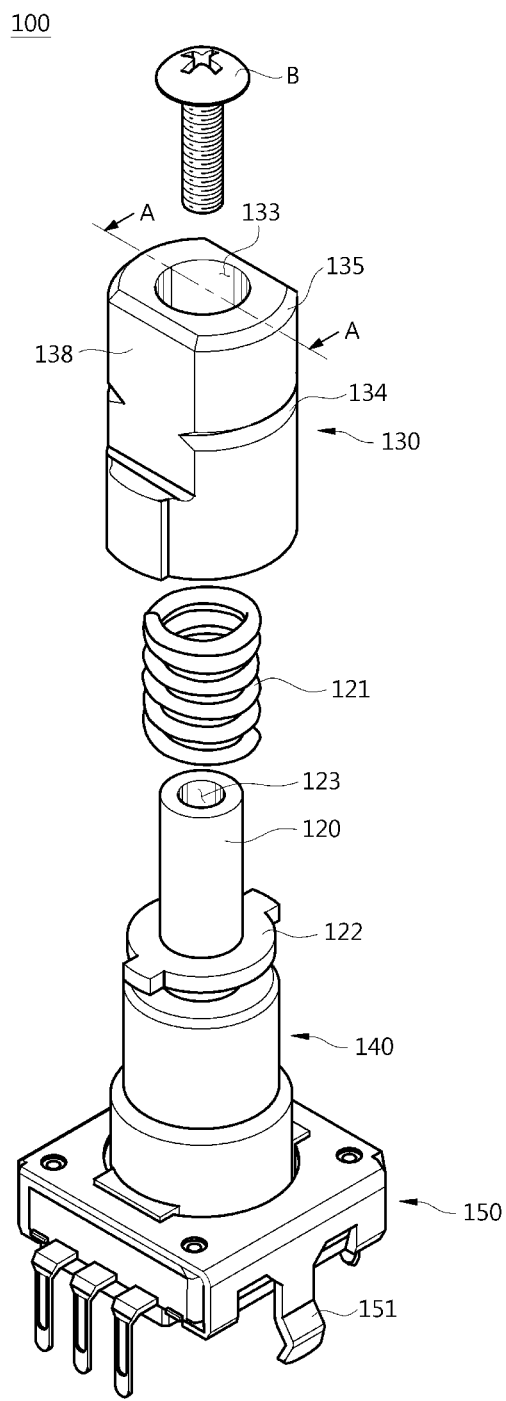
FIG. 5 is an exploded perspective view of FIG. 4.

The control knob device 100 in accordance with embodiments of the present invention will be described with reference to FIGS. 4 to 8. FIG. 4 is a perspective view illustrating the control knob device 100 in accordance with an embodiment of the present invention, FIG. 5 is an exploded perspective view of FIG. 4, FIGS. 6 to 8 are cross-sectional views respectively illustrating the control knob device 100 in accordance with an embodiment of the present invention. For reference, in the control knob device 100 as depicted, configurations corresponding to the knob cap 31 of FIGS. 2 and 3 are omitted.

The control knob device 100 includes a head 130 connected with a knob cap (not shown), a shaft 120 connected with the head 130 to perform a reciprocating action, a boss 140 surrounding an outer circumferential surface of the shaft 120, and a switch part 150 configured to output a signal according to movement of the shaft 120.

The head 130 may be provided as a separate member coupled with the knob cap, or may be integrally formed with the knob cap. However, the knob cap is generally coupled with the head 130 to improve the user's operating impression, and aesthetics.

A first directional end (hereinafter, a first direction means an upward direction in the drawing) of the head 130 is opened to form an insertion hole 133 in which a bolt B may be inserted, and a second directional end (hereinafter, a second direction means a downward direction in the drawing) thereof is opened to form a shaft receiving hole 131 which may receive the shaft 120.

The bolt B serves as a stopping part which partially restricts the shaft 120 and the head 130 to prevent the shaft 120 from being separated in the second direction or to prevent the head 130 from being separated in the first direction. As an example, the surface area of the bolt B may be greater than the outer diameter of the shaft 120, and a support step 136 may be formed at a lower portion of the insertion hole 133 to reduce the inner diameter of the insertion hole 133. An inner diameter of the support step 136 may be formed to receive the shaft 120 but to be smaller than the surface area of the bolt B, such that the bolt B is not separated. Meanwhile, the bolt B may be coupled to a screw thread of a coupling hole 123 formed at a second directional end of the shaft 120.

Although not shown in the drawings, a protrusion configured to protrude from an inner lower surface of the knob cap may be inserted in the insertion hole 133 of the head 130 so that the knob cap and the head 130 are firmly coupled with each other.

A fixing groove 134 corresponding to a protrusion protruding from an inner side surface of the knob cap may be formed at an outer circumferential surface of the head 130. In one method of fixing the knob cap to the head 130, the head 130 is inserted into a hollow portion of the knob cap, and the knob cap is press-fitted so that the protrusion protruding from the inner circumferential surface of the knob cap is inserted into the fixing groove 134 formed at the outer circumferential surface of the head 130. Meanwhile, an inclined portion 135 or a curved portion may be provided at an edge of a first directional end of the head 130 so that the head 130 may be easily inserted into the hollow portion of the knob cap.

Referring to FIG. 5, rotation preventing portion 138 may be provided at the outer circumferential surface of the head 130. The rotation preventing portion 138 prevents the head 130 from being rotated separately from the knob cap. That is, when the user turns the knob cap, the head 130 may be also integrally rotated. FIG. 5 illustrates that a surface as an example of the rotation preventing portion 138 is machined at the curved outer circumferential surface. However, rotation may be prevented using a key or a spline.

The shaft 120 having an axial shape is provided to be capable of reciprocating in the first and second directions. A first directional side of the shaft 120 may be received in the shaft receiving hole 131, and a second directional side thereof may be inserted into a shaft insertion hole 141 of the boss 140, and the coupling hole 123 into which the bolt B is coupled is provided at a first directional end of the shaft 120.

A separation preventing ring 124 may be protrudingly provided at the outer circumferential surface of the shaft 120. The separation preventing ring 124 may prevent the shaft 120 from being separated from the shaft insertion hole 141 of the boss 140. The separation preventing ring 124 may be integrally formed with the shaft 120, or may be formed in a ring or clip shape inserted into a groove provided at the outer circumferential surface of the shaft 120.

Figure 6:
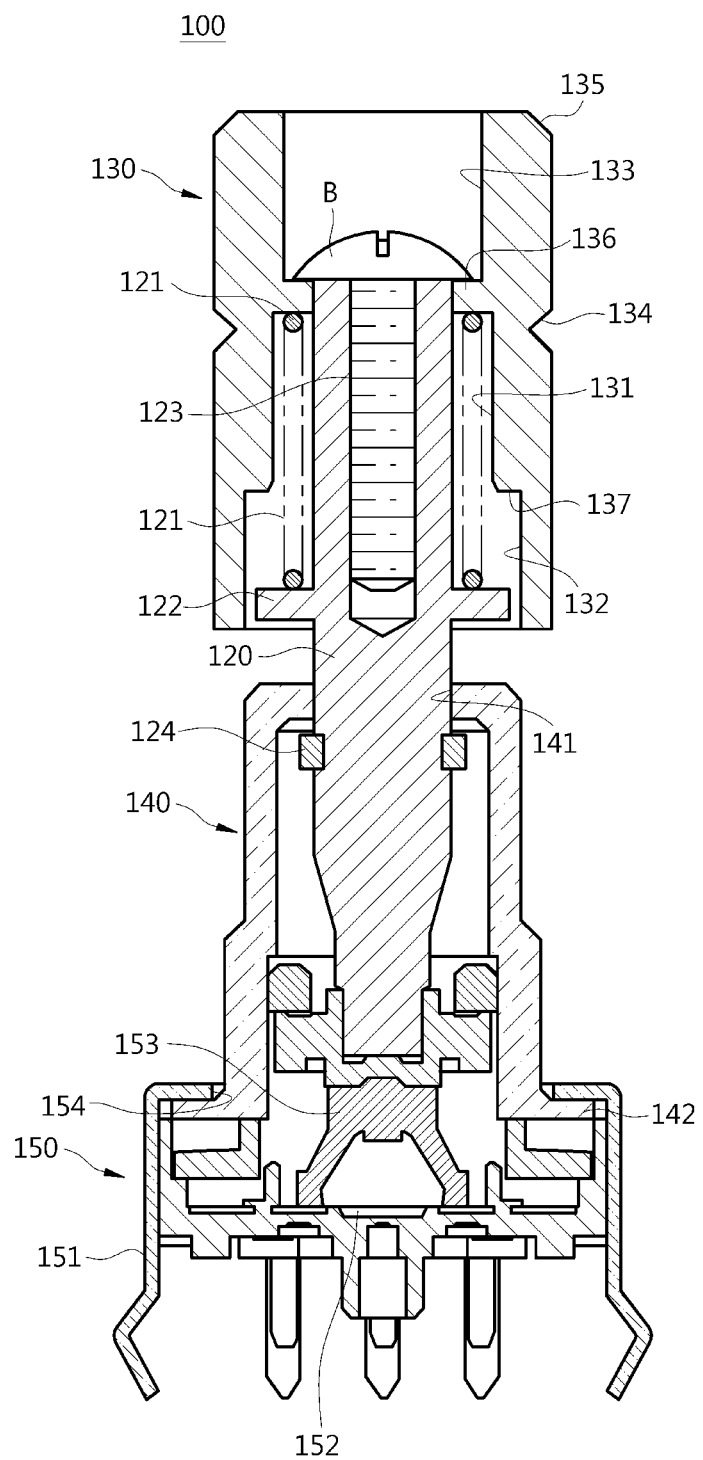

The shaft 120 is pressed by a load applied to the head 130, and slid into the shaft insertion hole 141, thereby deforming an elastic member 153 and operating a switch 152 (FIG. 6).

To this point, only a translation motion of the shaft 120 has been described. However, the shaft 120 may be rotated together with a rotation of the head 130. A detailed description of a configuration which allows the shaft 120 to be rotated together with the head 130 and of outputting a signal to the switch part 150 according to rotation of the shaft 120 will be omitted, as prior art showing suitable volume knobs is plentiful. The elastic member 153 may be received in the boss 140 or the switch part 150, and may be disposed between the shaft 120 and the switch 152. The elastic member 153 may be located to be adjacent to the shaft 120. Herein, a state of being located adjacent includes being in contact with each other. In FIG. 6, another member is disposed between the elastic member 153 and the shaft 120, but description thereof will be omitted.

The elastic member 153 is deformed by a load applied from the shaft 120, and allows the switch 152 to output the signal. Meanwhile, when the load of the shaft 120 is removed, the elastic member 153 may be returned to its original shape, spaced from the switch 152, and may also return the shaft 120 to its original position.

An elastic force and shape of the elastic member 153 are associated with the user's impression of operation when the user presses the knob cap to input a signal. Generally, the height difference of the shaft 120 generated while the elastic member 153 is deformed is about 1.5 mm. If the height difference is greater than 1.5 mm, impression may deteriorate.

The switch part 150 is located under the shaft 120, and may include a housing 151, the switch 152, the elastic member 153, and a printed circuit board (PCB). The housing 151 may receive the switch 152, the elastic member 153, and the PCB, and may be installed at an external device.

The switch 152 may be connected with the PCB, and the PCB may process the signal output from the switch 152 or may transfer the signal to a separate control part. Until now, signal processing only when the user presses the knob cap has been described. However, even when the user turns the knob cap, a corresponding signal may be input to the PCB.

The boss 140 surrounds the shaft 120, and the shaft insertion hole 141 through which the shaft 120 passes is formed at an end of the boss 140 to receive the side of the shaft 120.

A second directional end of the boss 140 may be inserted and supported into a boss insertion hole 154. As an example, the end of the boss 140 may include a flange portion 142 which protrudes from an outer circumferential surface thereof, and the flange portion 142 may be supported and fixed to an inner side surface of the boss insertion hole 154 of the housing 151.

The control knob device 100 in accordance with the currently described embodiment of the present invention may include a deformable member 121. The deformable member 121 is provided between the head 130 and the shaft 120 so that the load applied to the head 130 is transferred to the shaft 120, and thus the shaft 120 is pressed. Specifically, one end of the deformable member 121 may be supported under the support step 136 (protruding from an inner circumferential surface of the shaft receiving hole 131), and a second end thereof may be supported on a support step 122 protruding from the outer circumferential surface of the shaft 120.

The deformable member 121 may be deformed by a load which is greater than that at a moment when the elastic member 153 is deformed and the switch 152 outputs the signal, and may change the relative position between the head 130 and the shaft 120. For example, the deformable member 121 may be deformed by a load which is greater than a minimum load necessary to deform the elastic member 153 so that the switch 152 outputs the signal. That is, the deformable member 121 may be not deformed while the elastic member 153 is pressed and deformed.

Deformation of the deformable member 121 encompasses irreversible deformation and reversible deformation. If the deformable member 121 is irreversibly deformed, the deformable member 121 is broken by shock. Therefore, repair or replacement is required for reuse.

If the deformable member 121 is reversibly deformed, the deformable member 121 will return to its original shape, when the load applied to the deformable member 121 is removed. For example, the deformable member 121 may be formed of an elastically deformable material or may be formed in an elastically deformable shape. In the drawings, a coil spring is illustrated. However, the deformable member 121 which is reversibly deformed may be formed in various shapes such as a leaf spring, or may be formed of a material such as synthetic rubber, and may also include various other embodiments having elasticity.

An operation of the control knob device 100 in accordance with one embodiment of the present invention will be described with reference to FIGS. 6 to 8.

FIG. 6 illustrates a state before the control knob device is pressed. Since both the elastic member 153 and the deformable member 121 maintain their own shape before being deformed, the shaft 120 and the head 130 are in a state of being pushed up in the first direction.

However, since the boss 140 is caught at an inner side of the boss insertion hole 154 of the switch part 150 by the flange portion 142, the shaft 120 is caught at an inner side of the shaft insertion hole 141 by the separation preventing ring 124 installed at the outer circumferential surface of the shaft 120. The support step 136 of the head 130 is caught at an inner side of the bolt B, the boss 140, the shaft 120. The head 130 thus may not be separated in the first direction and may be maintained in a unitary state.

Figure 7:
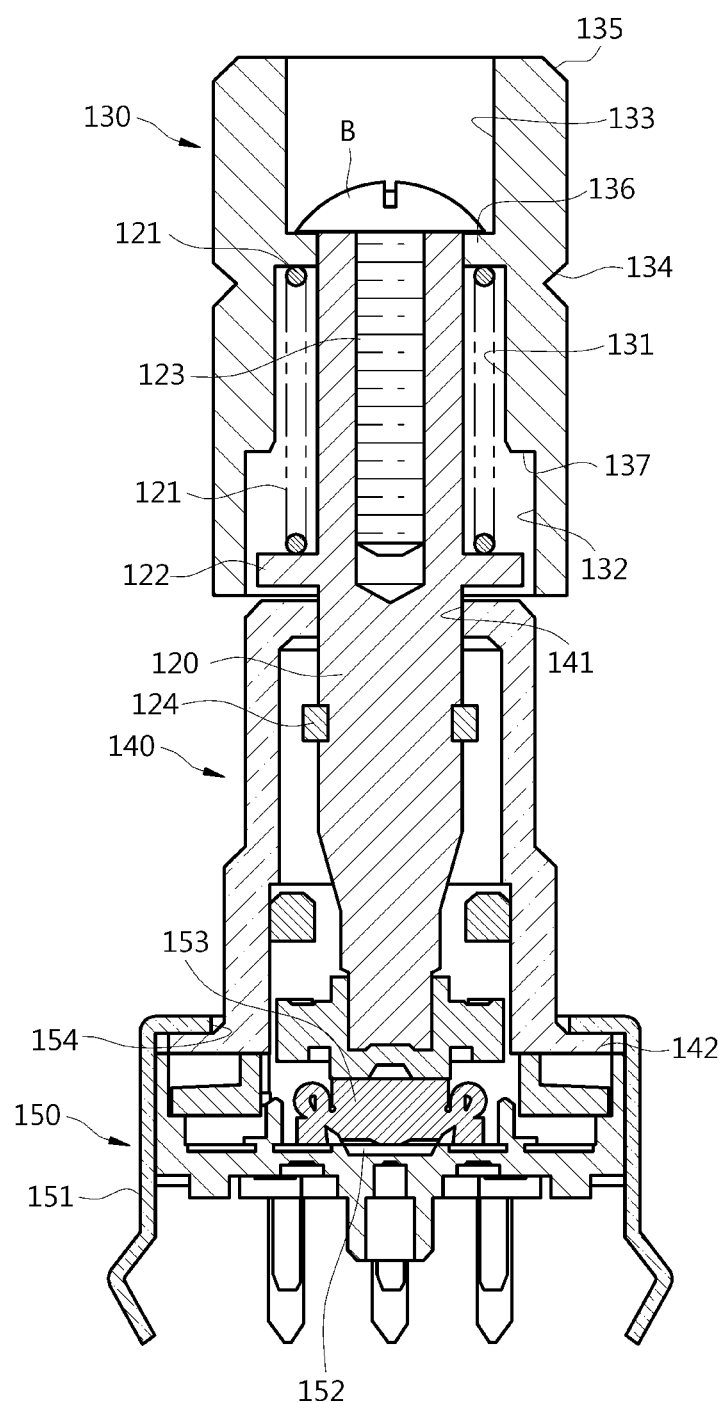

FIG. 7 illustrates a state of the control knob device pressed with a force within a range in which the switch 152 is generally operated. Since the force is still short of a threshold value (a load value in which the deformation of the deformable member 121 is started) which deforms the deformable member 121, the deformable member 121 may directly transfer to the shaft 120 the force applied to the head 130. Therefore, in a state in which the relative position between the head 130 and the shaft 120 is constant, the shaft 120 is moved in the second direction.

However, that the deformable member 121 is not deformed should be interpreted to mean a degree of deformation to which the user may recognize does not occur, but not to a meaning that any physical deformation does not occur.

The shaft 120 is slid into the shaft insertion hole 141 of the boss 140 by the load transferred from the deformable member 121, thereby pressing and deforming the elastic member 153 provided at the end of the shaft 120.

The switch 152 outputs the signal to the PCB by the deformed elastic member 153. As an example, the switch 152 may output the signal by contact with a part of the elastic member 153. FIG. 6 illustrates a state in which the elastic member 153 is not in contact with the switch 152, and FIG. 7 illustrates a state in which the elastic member 153 is deformed and thus is in contact with the switch 152.

FIG. 7 illustrates that a lower portion of the support step 122 of the shaft 120 is not in contact with the first directional end of the boss 140. On the other hand, the lower portion of the support step 122 of the shaft 120 may be in contact with the first directional end of the boss 140 and may serve as a stopper which restricts range of movement of the shaft 120. If movement of the shaft 120 is not restricted, an upper limit of the load applied to the switch 152 may not be restricted, when a substantial load is applied to the head 130. That is, the support step 122 of the shaft 120 may serve as the stopper and thus may remove a possibility that a substantial shock is applied to the switch 152 such that the switch 152 is damaged or malfunctions.

Figure 8:
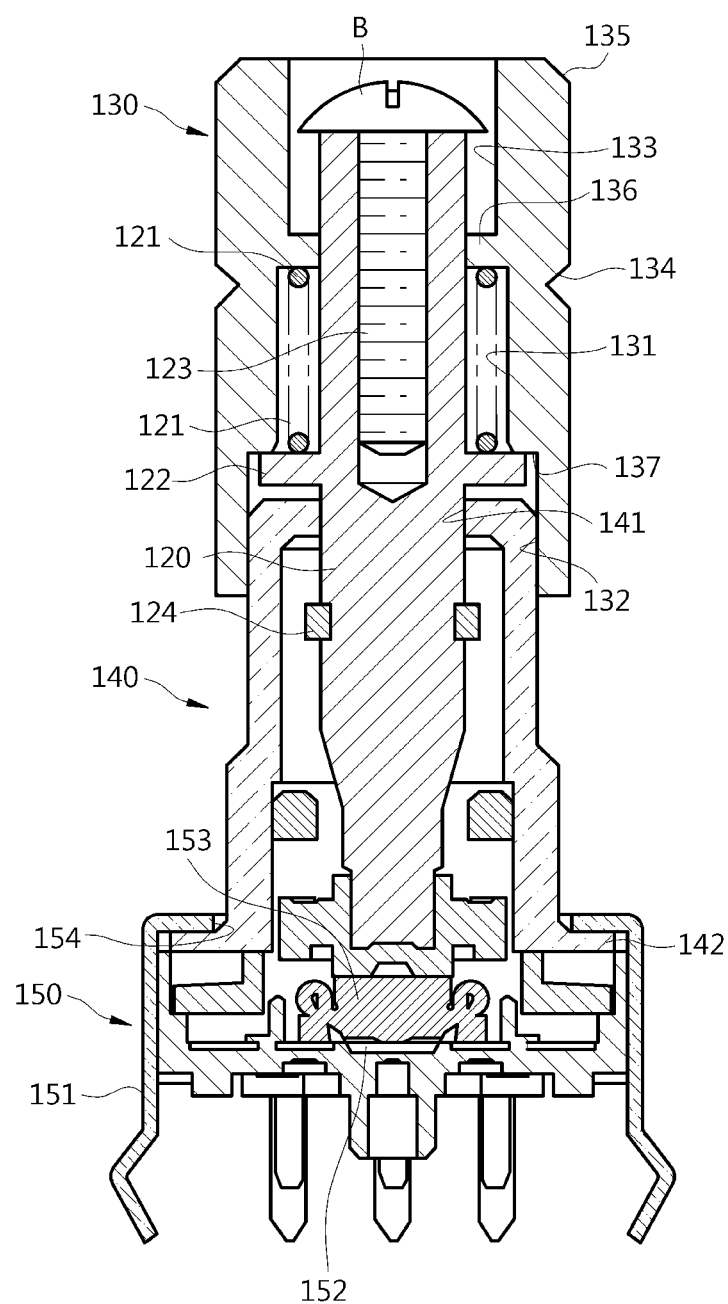

FIG. 8 illustrates a state of the control knob device pressed with a degree of force, to which a shock is applied. The degree of force, to which the shock is applied, means that to which a passenger's head or the like collies with the knob cap due to vehicle collision or sudden braking.

When the load applied to the head 130 exceeds a deformation threshold value of the deformable member 121, the deformable member 121 deforms, and the relative position between the head 130 and the shaft 120 changes. FIG. 8 illustrates a coil spring as the deformable member 121 being compressed, and the head 130 moving down in the second direction. At this time, since the shaft 120 is supported by the elastic member 153, or the support step 122 of the shaft 120 is supported by the end of the boss 140, the shaft 120 may not be further inserted.

A boss insertion hole 132 may be formed at a second directional end of the head 130 so that the first directional end of the boss 140 is inserted therein. Therefore, while the head 130 is moved in the second direction by the load, the first directional end of the boss 140 may be guided along an inner surface of the boss insertion hole 132 and inserted therein. Since the boss 140 is inserted into the head 130, the head 130 may be prevented from deviating from a vertical direction.

FIGS. 6 and 7 illustrate a state in which the boss 140 is not inserted into the head 130, before the deformable member 121 is deformed. However, the boss 140 may be inserted into the head 130, i.e., the boss insertion hole 132, before the deformable member 121 is deformed.

FIG. 8 illustrates a stopping part 137 formed at a connecting portion of the shaft receiving hole 131 and the boss insertion hole 132 of the head 130. An upper portion of the support step 122 of the shaft 120 is caught by the stopping part 137, and thus an insertion degree of the boss 140 inserted into the boss insertion hole 132 may be restricted. That is, the stopping part 137 and the support step 122 may serve as the stopper.

If a configuration such as the stopping part 137 configured to restrict the range of downward movement of the head 130 is not provided, the head 130 may be further moved down according to intensity of load. If a reversibly deformable elastic body is used as the deformable member 121, the head 130 may compress the deformable member 121 beyond an elastic limit of the deformable member 121. When the elastic body is compressed beyond the elastic limit thereof, the shape of the elastic body may not be reversibly returned. Therefore, since the stopping part 137 of the head 130 and the support step 122 of the shaft 120 restrict the range of downward movement of the head 130, the deformable member 121 may be protected.

Figure 9:
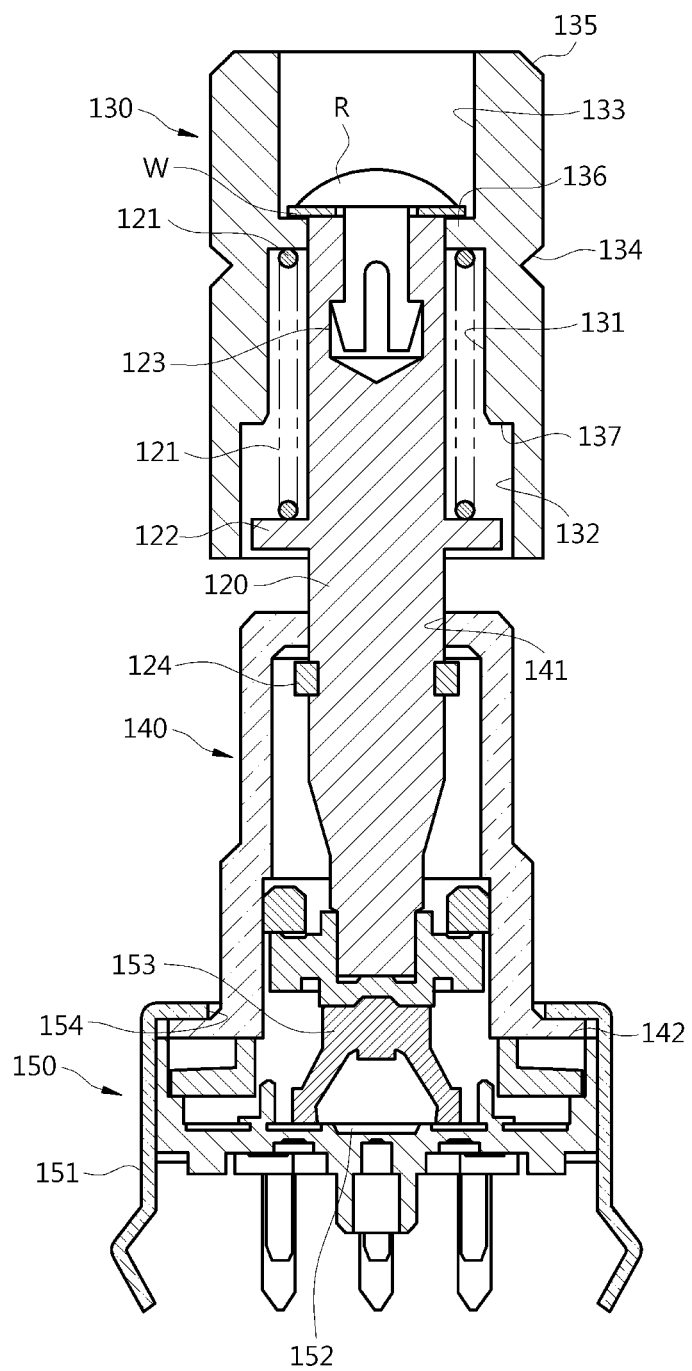
FIG. 9 is an exploded perspective view of a control knob device in accordance with another embodiment of the present invention.

FIG. 9 is an exploded perspective view of a control knob device 100 in accordance with another embodiment of the present invention.

The control knob device 100 in accordance with this embodiment of the present invention uses a rivet R, instead of the bolt B of FIG. 6, to restrict the head 130 onto the shaft 120. A washer W may be provided between the rivet R and the shaft 120. The washer W may reduce spacing due to rivet coupling.

Figure 10:
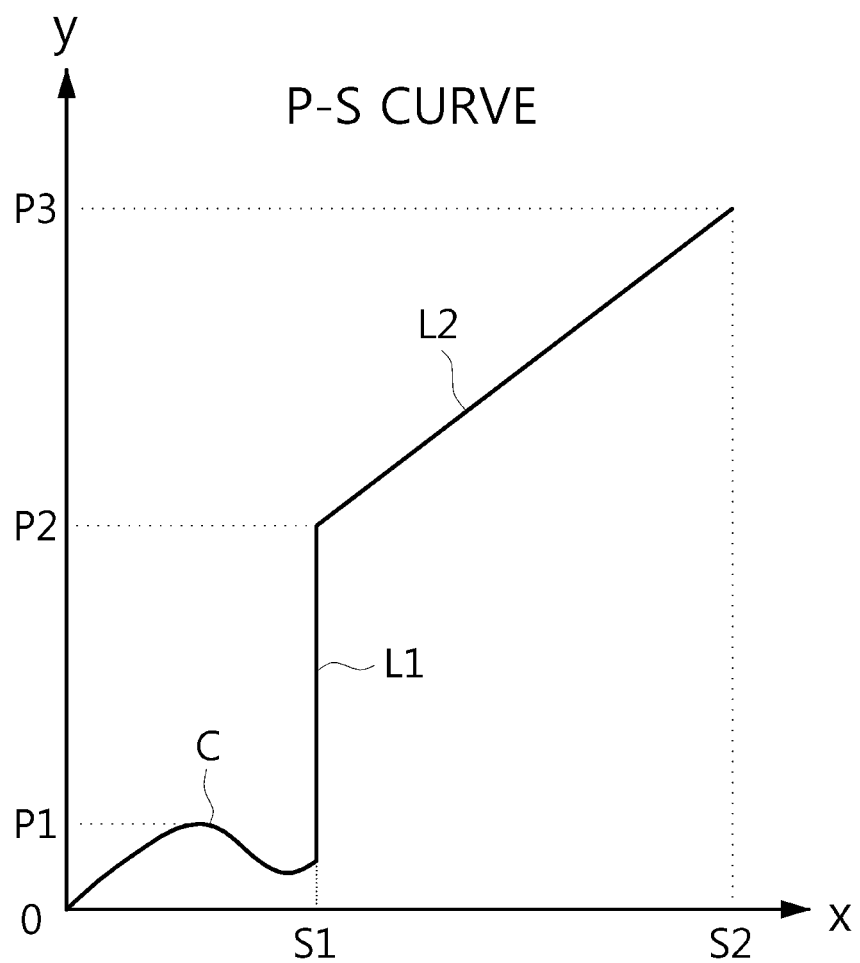
FIG. 10 is a graph illustrating a degree to which the control knob device is pressed according to an intensity of force.

FIG. 10 is a graph of moving distance with respect to pressure, illustrating degree to which the control knob device is pressed according to intensity of force, The X-axis of the graph indicates a second directional moving distance of the knob cap or the head 130, and the Y-axis thereof indicates load applied to the knob cap or the head 130, by units of pressure. The origin (0, 0) of the graph indicates a state in which no load is applied to the control knob device 100.

Curve C is a section in which the user applies the load to the knob cap or the head 130 to operate the switch 152. The user may provide load P1 and may operate the switch 152, P1 being intensity of force used to deform the shape of the elastic member 153. Meanwhile, the knob cap or the head 130 is moved by a distance S1 (about 1.5 mm) until the switch 152 is operated.

An upwardly convex curve shape in curve C is associated with the shape of the elastic member 153. Further, when the upwardly convex curve is formed, the user's impression during operation may be enhanced.

Straight line L1 is a section at which the knob cap or the head 130 is not moved, although the intensity of load applied by the user is increased, Straight line L2 is a section at which the knob cap or the head 130 is linearly moved in proportion to the load applied by the user.

The threshold value of the load, in which the deformation of the deformable member 121 is started, is P2 in the graph. Until the load arrives at P2, movement of the knob cap or the head 130, which is recognized by the user, does not occur.

FIG. 10 of the graph applies when using the deformable member 121 which is linearly deformed, for example, when using the coil spring. The coil spring used as the deformable member 121 may conform with a graph of $y=k(x-S1)+P2$. However, linear deformation is only one example of one property of the deformable member 121, and includes a case in which a straight line or curved graph different from L2 is formed.

To this point, the graph of moving distance with respect to pressure, formed when the control knob device 100 is pressed at low speed, has been described. However, it should be noted that the graph of FIG. 10 may be changed when a substantial load is applied rapidly.

Figure 11:
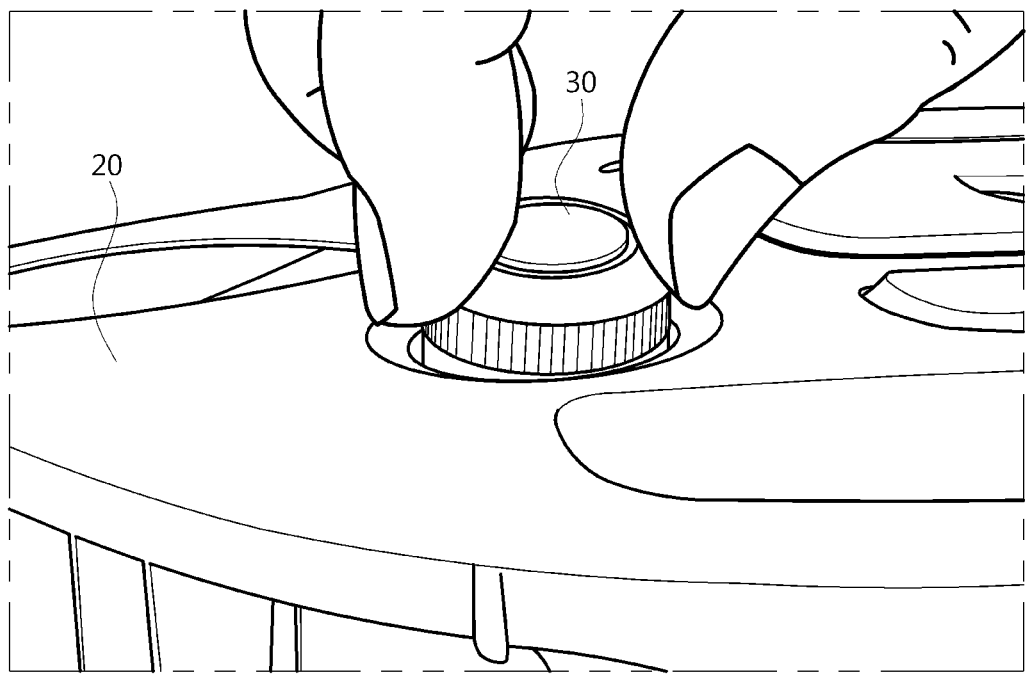
FIG. 11 is a view illustrating a state in which a user controls a volume using the conventional control knob device.
Figure 12:
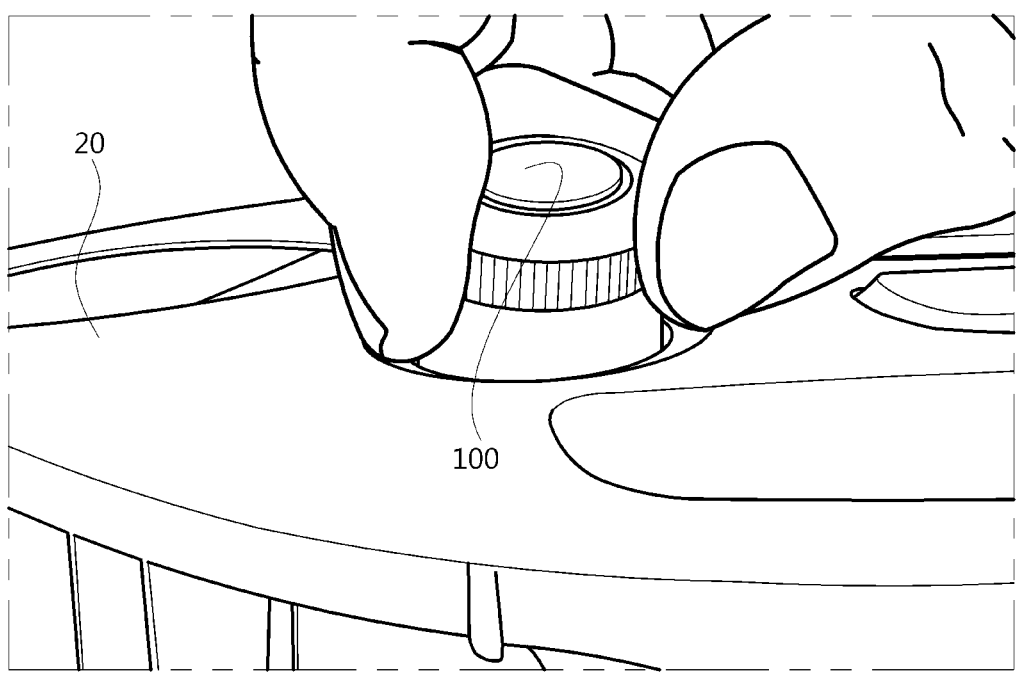
FIG. 12 is a view illustrating a state in which the user controls the volume using the control knob device in accordance with an embodiment of the present invention.

FIGS. 11 and 12 are views comparing and illustrating the control knob device 100 in accordance with the conventional control knob device 30 and the described embodiment of the present invention, respectively. In FIG. 11, the user controls volume using the conventional control knob device 30, and in FIG. 12, the user controls the volume using the control knob device 100 in accordance with the described embodiment of the present invention.

As illustrated in FIG. 11, since the conventional control knob device 30 should observe the European automobile safety standard, protrusion from the front panel is not sufficient. Therefore, it is very inconvenient for the user to grip and turn the knob, and this leads to user complaint.

In comparison, it may be understood that the control knob device 100 in accordance with the embodiment of the present invention protrudes sufficiently, as illustrated in FIG. 12. Therefore, the user may more conveniently grip and turn the knob.

Although the control knob device 100 protrudes sufficiently as illustrated in FIG. 12, if the user collides with the control knob device 100, the knob cap may be further inserted toward the front panel 20 due to deformation of the deformable member 121, and thus may observe the European automobile safety standard.

The control knob device according to the described embodiment of the present invention can be inserted inside at the time of collision with the user, and thus can relieve shock.

Further, the control knob device according to the described embodiment of the present invention can provide a predetermined difference between pressure for operating the switch and pressure for inserting the knob into the front panel, and thus the user's operation feeing of the knob can be enhanced.

Further, the control knob device according to the described embodiment of the present invention can sufficiently protrude from the front panel, while satisfying the automobile safety standard, and thus can enhance the user's impression of the knob. And when the control knob device does not sufficiently protrude due to limitation of the automobile safety standard, it is possible to avoid applying a design in which the front panel around the knob is recessed so as to be inclined, thereby enhancing the aesthetics.

Further, in fabricating the knob used in the same AV system, when a general knob (having a design of protruding about 14 mm to 15 mm) and a European knob (having a design of protruding about 10 mm to 11 mm to observe the European automobile safety standard) are separately fabricated, at least two pairs of molds must be provided (i.e., dualize a production line for the same product), and thus it is possible to solve the problem that fabrication and maintenance costs are otherwise increased.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A control knob device, comprising:
    a shaft connected with a knob cap;
    a switch part comprising an elastic member pressed and elastically deformed by the shaft and a switch located adjacent to the elastic member, the switch outputting a signal by a deformation of the elastic member;
    a deformable member deformable by a load which is greater than that when the elastic member is deformed and the switch outputs the signal, and being configured to change a relative position between the knob cap and the shaft; and
    a head connected with the knob cap and having a shaft receiving hole configured to receive the shaft,
    wherein one side of the deformable member is supported by the head, and the other side thereof is supported by the shaft, and the shaft is configured to be pressed by a load applied to the head, and
    wherein one side of the deformable member is supported by a support step protruding from an inner circumferential surface of the shaft receiving hole, and the other side thereof is supported by a support step protruding from an outer circumferential surface of the shaft.

2. The control knob device according to claim 1, wherein the deformable member is elastically deformable.

3. The control knob device according to claim 2, wherein the deformable member presses and moves the shaft within a range in which the shaft is moved, and when the shaft is supported by the switch part and a movement of the shaft is restricted, elastic deformation thereof is allowed.

4. The control knob device according to claim 1, further comprising a boss coupled with the switch part and having a shaft insertion hole in which the shaft is inserted,
    wherein a height between an end of the boss, in which the shaft insertion hole is formed, and the support step protruding from the outer circumferential surface of the shaft is greater than or the same as that by which the shaft is inserted into the boss by the deformation of the elastic member.

5. The control knob device according to claim 1, further comprising a boss coupled with the switch part and having a shaft insertion hole in which the shaft is inserted,
    wherein the boss insertion hole is formed at the head, and when the deformable member is deformed, the boss is inserted and received into the boss insertion hole.

6. The control knob device according to claim 5, wherein an insertion degree of the boss inserted into the boss insertion hole is restricted by a stopping part formed at a connecting portion of the shaft receiving hole and the boss insertion hole.

7. The control knob device according to claim 5, wherein an inclined portion or a curved portion is provided at an edge of an end of the boss, in which the shaft insertion hole is formed, to guide the boss to be easily inserted into the boss insertion hole.

8. The control knob device according to claim 1, wherein the deformable member is deformed by a load which is greater than a minimum load necessary to deform the elastic member and to adapt the switch to output the signal.

9. A control knob device having a knob cap and a switch, comprising:
    an elastic member elastically deformed within a predetermined range of a first load applied to the knob cap;
    a switch configured to output a signal by a deformation of the elastic member;
    a deformable member deformed by a second load applied to the knob cap greater than the first load to allow a movement of the knob cap; and
    a head connected with the knob cap, and a shaft of which one side is received in a shaft receiving hole of the head, and the other side is configured to press the elastic member,
    wherein one side of the deformable member is supported by a support step protruding from an inner circumferential surface of the shaft receiving hole, and the other side thereof is supported by a support step protruding from an outer circumferential surface of the shaft, and the shaft is configured to be pressed by a load applied to the head.

10. The control knob device according to claim 9, wherein the deformable member is started to be elastically deformed by the second load.

11. The control knob device according to claim 9,
    wherein, when the knob cap is pressed within a range of the first load, the shaft is moved together with the head, the elastic member is deformed, and the switch outputs the signal, and when the knob cap is pressed by a load greater than the second load, the deformable member is deformed, and a relative movement of the head and the shaft is allowed.

12. The control knob device according to claim 1, further comprising a switch part comprising the switch, and a boss coupled with the switch part and having a shaft insertion hole in which the shaft is inserted, wherein a height between an end of the boss, in which the shaft insertion hole is formed, and the support step protruding from the outer circumferential surface of the shaft is greater than or the same as that by which the shaft is inserted into the boss by the deformation of the elastic member.

* * * * *